United States Patent [19]
Geraghty et al.

[11] Patent Number: 5,706,005
[45] Date of Patent: Jan. 6, 1998

[54] D/A CONVERTER WITH IMPROVED MEANS TO PREVENT OUTPUT SIGNAL INSTABILITY

[75] Inventors: Donal Geraghty; Michael G. Curtin, both of Limerick, Ireland

[73] Assignee: Analog Devices, Incorporated, Norwood, Mass.

[21] Appl. No.: 550,343

[22] Filed: Oct. 30, 1995

[51] Int. Cl.$^6$ .................................................. H03M 1/66
[52] U.S. Cl. ............................................. 341/144; 361/92
[58] Field of Search ........................... 341/144; 361/56, 361/90–92

[56] References Cited

U.S. PATENT DOCUMENTS

| | | | |
|---|---|---|---|
| 4,520,418 | 5/1985 | Susi | 361/92 |
| 5,224,010 | 6/1993 | Tran et al. | 361/90 |
| 5,258,758 | 11/1993 | Sooch | 341/144 |

Primary Examiner—Jeffrey A. Gaffin
Assistant Examiner—Peguy Jean Pierre
Attorney, Agent, or Firm—Parmelee & Bollinger, LLP

[57] ABSTRACT

An integrated-circuit (IC) chip formed with a D-to-A converter (DAC) and an amplifier to receive the DAC output and to produce a corresponding signal for an output terminal. The chip includes control circuitry to prevent harmful instability in the signal at the output terminal during times that one or more power supply voltages are changing. The control circuitry includes a voltage-monitoring device which produces a RESET signal when a monitored supply voltage is beyond its nominal operating range. The RESET signal de-activates the amplifier input and output circuits, and following a short time delay after the start of RESET, disables the amplifier by killing the amplifier bias currents. The chip is arranged to receive a RESET signal from external devices, and to produce a RESET signal for any other devices in the system.

31 Claims, 11 Drawing Sheets

D/A CONVERTER WITH IMPROVED MEANS TO PREVENT OUTPUT SIGNAL INSTABILITY

BACKGROUND OF THE INVENTION

1. Field of the Invention

This invention relates to D/A converters. More particularly, this invention relates to such converters used in applications where instability in the converter output signal can cause severe difficulties.

2. Description of the Prior Art

D/A converters are used in many different kinds of systems, and in some of those systems any instability in the converter output signal, such as so-called "glitches", can result in serious problems. For example, D/A converters frequently are used in modern process control systems to supply control signals to process valves, drive motors, actuators, and the like. Instability in the signals directed to such devices can result in serious harmful effects in the performance of the process. A common cause of such signal instability in prior systems has been the loss of electrical power to the D/A converter, as well as erratic performance of the converter circuitry during power-up of the system.

In U.S. Pat. No. 5,319,371 issued to Michael Curtin et al on Jun. 7, 1994, there is described A D/A converter provided with a power voltage monitor which continuously senses the voltage of the DC electrical power supplied to the converter. Such supply voltage might for example nominally be 15 volts, and is used to energize major portions of the circuitry including the amplifier which develops the converter output signal. When the power first comes on and the voltage begins its ramp-up from zero, the voltage monitor produces a control signal which (a) closes one transmission gate to clamp the output terminal of the converter to ground so that no signal will appear at that point, and (b) opens a second transmission gate to isolate the amplifier output circuitry from the grounded output terminal.

As the power supply voltage continues its ramp up and reaches a preset high level, such as 10 volts, the voltage monitor senses this. When a valid digital word subsequently is written to and loaded in the D/A converter, the two transmission gates at the output of the amplifier are operated to (a) unground the output terminal and (b) connect the amplifier output circuitry to that terminal.

Upon power-down, or inadvertent loss of power, the sequence is reversed. That is, when the voltage drops to the preset high level such as 10 volts, the converter output terminal will be clamped to ground and the amplifier output circuit will be isolated from the output terminal.

Although the above-described circuitry has provided important benefits in the performance of D/A converters, experience has shown that some instability problems nevertheless can still arise. It is an object of this invention to assure a perfectly glitch-free transition and avoid such instability problems.

SUMMARY OF THE INVENTION

In a preferred embodiment of the present invention, to be described below in detail, an IC chip is provided having a D/A converter together with power voltage monitors which continuously sense three electrical power voltages supplied to the converter. For example, the voltages monitored comprise a positive supply ($V_{DD}$) of 15 volts, a negative supply ($V_{SS}$) of −15 volts, and a logic supply ($V_{CC}$) of +5 volts. Such voltages energize major portions of the circuitry including the operational amplifier (op amp) which develops the converter output signal for the output terminal of the chip.

When there is a diminution of any or all of the monitored voltages below respective threshold levels, a control signal is produced which opens transmission gates to isolate the op amp input from the DAC output and to connect the op amp input to ground. At the same time, the op amp is configured as a unity gain buffer.

After a short time delay, to allow the op amp output to be driven to zero, bias voltages for the op amp are cut off so that it can no longer function as an amplifier. At the same time, additional transmission gates are activated to isolate the output of the op amp from the chip output terminal, and to ground that output terminal.

After the power comes back on, the supply voltage monitors determine when all three voltages again reach their respective thresholds, at which time the op amp bias voltages are restored. Thereafter, when a valid digital word is written to and loaded in the D/A converter, the op amp input is ungrounded and switched back to the DAC output, and the amplifier is reconfigured to the condition which existed before the power interruption.

Other objects, aspects and advantages of the invention will in part be pointed out in, and in part apparent from, the following description of a preferred embodiment of the invention, considered together with the accompanying drawings.

DETAILED DESCRIPTION OF A PREFERRED EMBODIMENT

Figure 1:
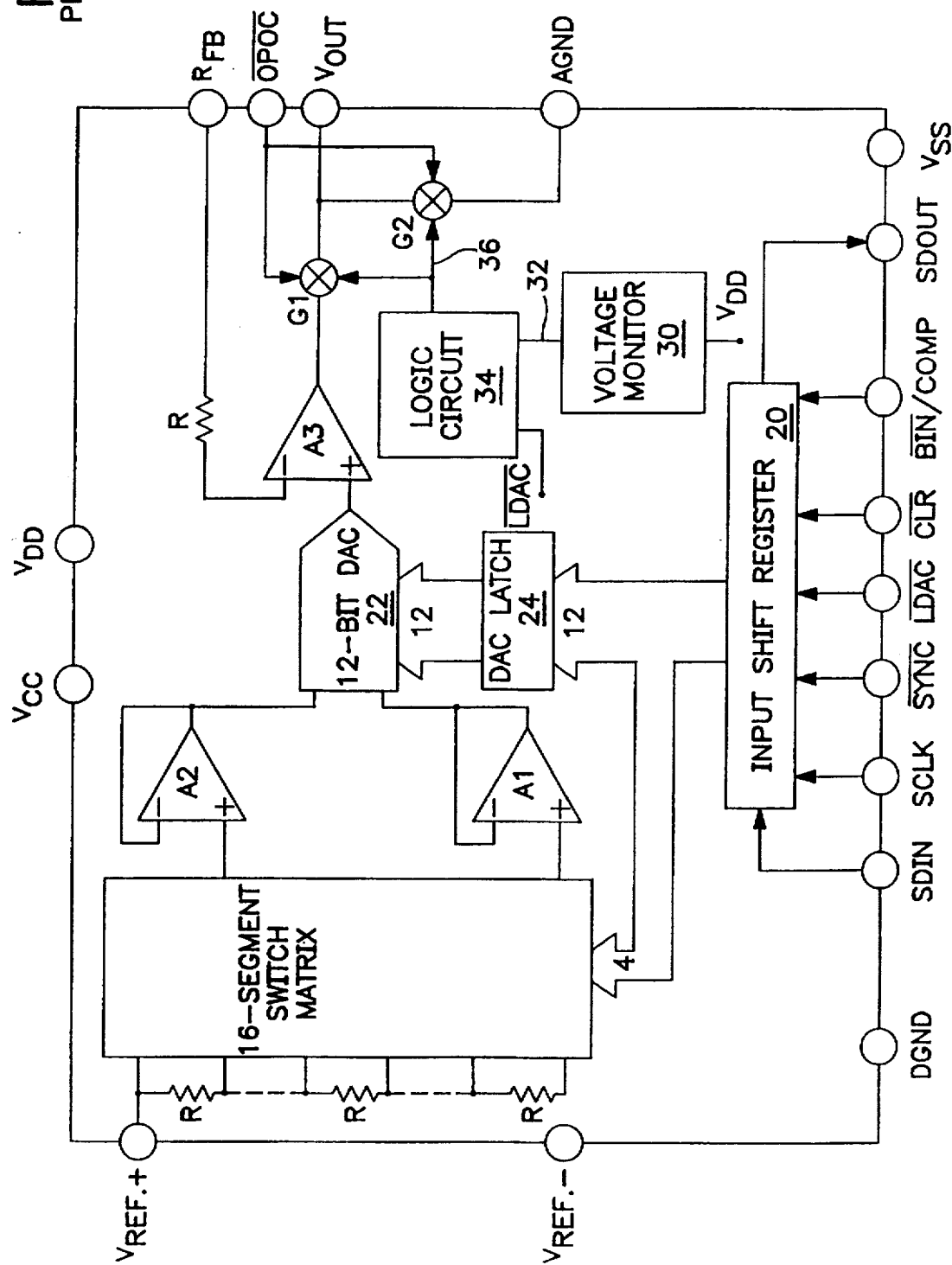
FIG. 1 is a block diagram illustrating an integrated circuit chip with a D/A converter as described in U.S. Pat. No. 5,319,371.

Referring first to FIG. 1, there is illustrated a D/A converter of known type (see U.S. Pat. No. 5,319,371) formed as an IC chip and arranged to receive 16 bits of signal input data in a shift register 20. This chip is provided with appropriate signal and control terminals well understood in this art, such as SDIN (serial data IN), SCLK (serial clock), LDAC (load DAC), etc., which typically are supplied with signals from a system processor operating under program control. In the particular type of converter used to illustrate the invention, the four most-significant bits are directed from the shift register to a 16-segment switch matrix the output of which is supplied to a 12-bit DAC 22 for decoding the remaining 12 bits of data from a DAC latch 24. The output of this DAC is directed to the non-inverting input terminal of an op amp 26 which produces an output signal for the D/A converter output terminal $V_{OUT}$. The inverting input terminal of the op amp is supplied with a signal which, as shown, is applied through a resistor R.

The chip also includes terminals to receive operating power, illustrated here as $V_{DD}$, $V_{SS}$ and $V_{CC}$. $V_{DD}$ is a positive supply voltage and may have a nominal value of 15 volts. $V_{SS}$ is a negative supply voltage, such as −15 volts. $V_{CC}$ is included for low-power logic° circuitry, such as latches, and for the shift register 20, and may have a nominal value of 5 volts.

Once operating properly, the system may lose power accidentally, or it may be shut down purposefully. In either event, such a power outage may cause one or more of the supply voltages to drop below a predetermined threshold level as shown graphically in FIG. 2. If no protective measures are taken (such as described hereinbelow), random voltage fluctuations could in the event of such power outage occur at the output of the op amp 26 after the supply voltage passes through the predetermined threshold level. More specifically, when the supply voltage is below the threshold level, the converter could be capable of producing harmful output fluctuations but incapable of proper converter and/or amplifier operation.

Such output signal fluctuations, occurring either during power-up or power-down of the system, could cause serious repercussions upon reaching sensitive process control apparatus such as valve actuators, drive motors, and so on.

In accordance with the present invention, such adverse consequences are avoided by means of special control circuitry built into the converter IC chip. FIG. 1 shows previously disclosed control circuitry comprising a voltage monitor 30 to which is connected a line carrying the DC power supply voltage $V_{DD}$. When $V_{DD}$ is on, this line supplies current to the monitor for its operation, and the monitor senses the voltage level and responds in ways described in U.S. Pat. No. 5,319,371. The present invention incorporates other features for assuring stable operation, as will be described hereinbelow.

Figure 2:
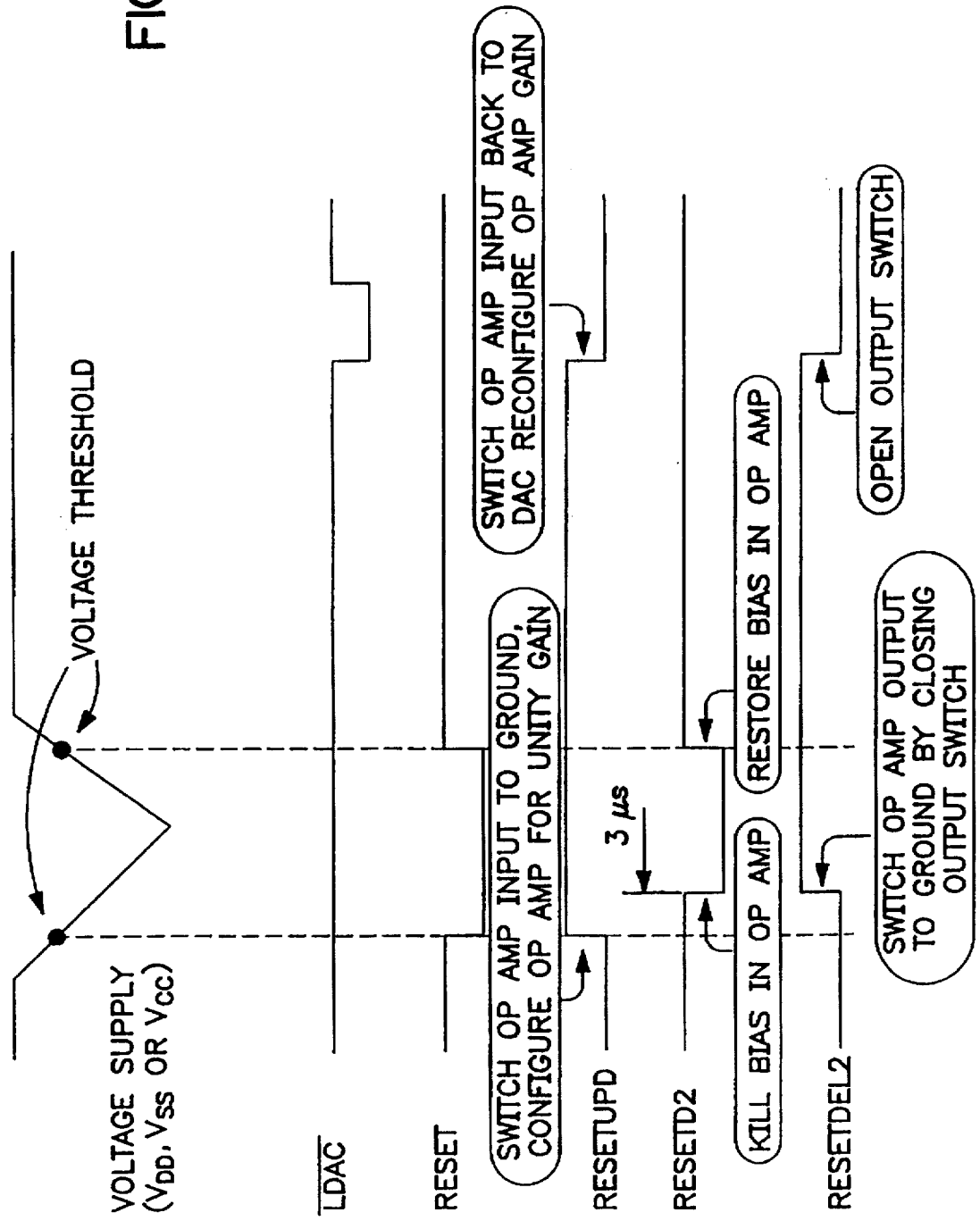
FIG. 2 is a graphical presentation showing how a supply voltage might vary upon power interruption, and presenting a timing diagram illustrating various control signals.
Figure 3:
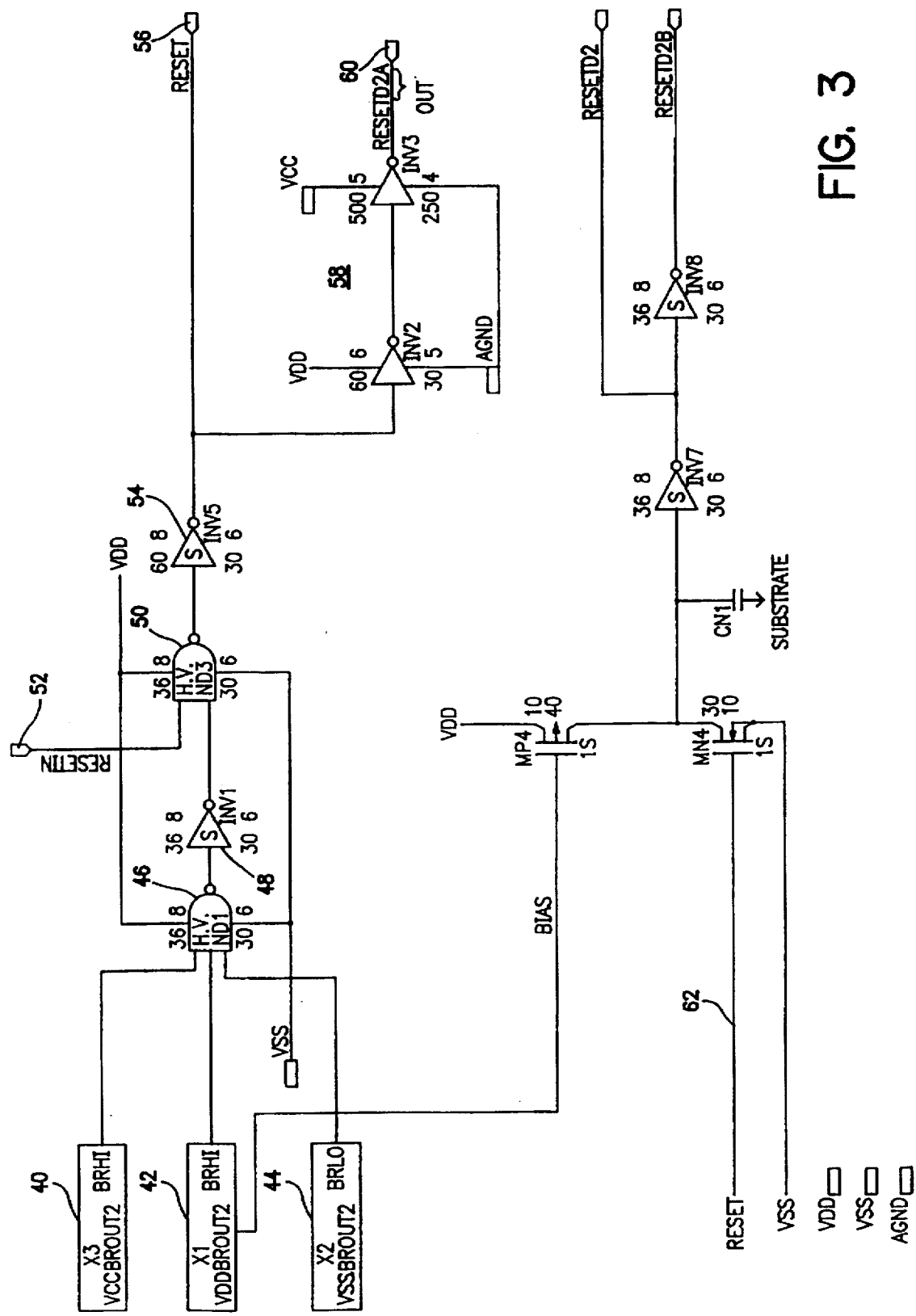
FIG. 3 is a block diagram showing the voltage monitoring arrangement and the circuitry for developing control signal delay.

As shown in FIG. 2, in the embodiment to be described, when any one of the monitored supply voltages drops below its threshold level, a control signal referred to as "RESET" is activated. The circuit for producing RESET is shown in FIG. 3, and includes three voltage monitors 40, 42, 44 for the three power supply voltages $V_{CC}$, $V_{DD}$ and $V_{SS}$. The outputs of these monitors are directed to a Nand gate 46 which directs a signal to an inverter 48 if any of the monitors senses that a voltage has dropped below its threshold.

The output of the inverter 48 is fed to another gate 50 together with a RESETIN signal from a pin 52 on the chip. This pin can receive an externally controllable signal from any device in the system for initiating the RESET function. The RESET signal from gate 50 is directed through an inverter 54 to the RESET output terminal 56. In addition, the RESET signal is directed through level-shifting circuitry 58 to a RESETOUT pin 60 to provide for supplying the RESET control signal to any other devices in the system as required by the user.

Referring now to the lower left-hand portion of FIG. 3, the RESET signal is directed by a lead 62 to a transistor MN4 connected in series with another transistor MP4 which is supplied with bias from the $V_{DD}$ voltage monitor 42. When RESET is activated, current is supplied by MP4 to a capacitor CN1, which charges up in a short time (e.g., 3 μsec) to develop a delayed signal RESETD2 (and its complement RESETD2B).

Figure 4A:
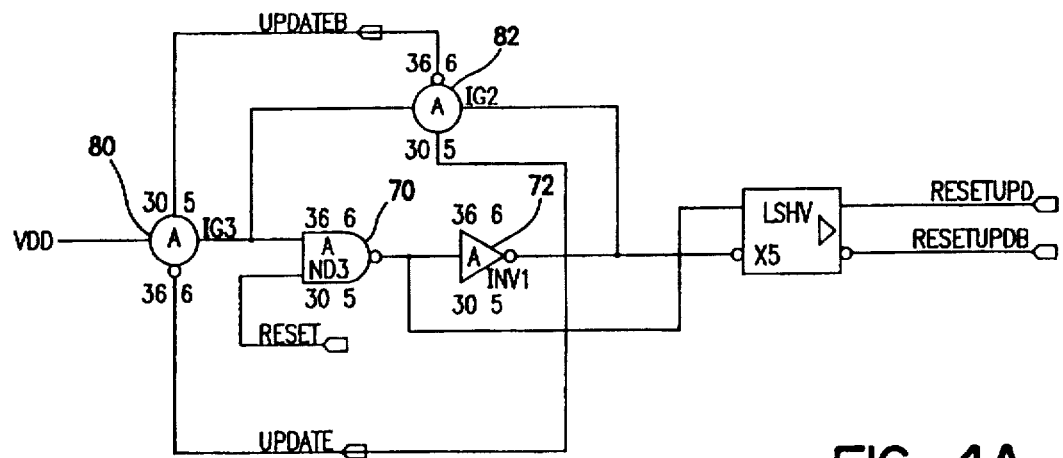
FIGS. 4A and 4B show circuitry for developing control signals.

FIG. 4A shows a control signal circuit which receives the RESET signal at a Nand gate 70 arranged with an inverter 72 as a latch. When the RESET signal is developed some time after the power supply voltages already have reached their proper operating level, that is, when there is a power outage, the latch output becomes low. The control signals RESETUPD and RESETUPDB are activated.

Figure 5A:
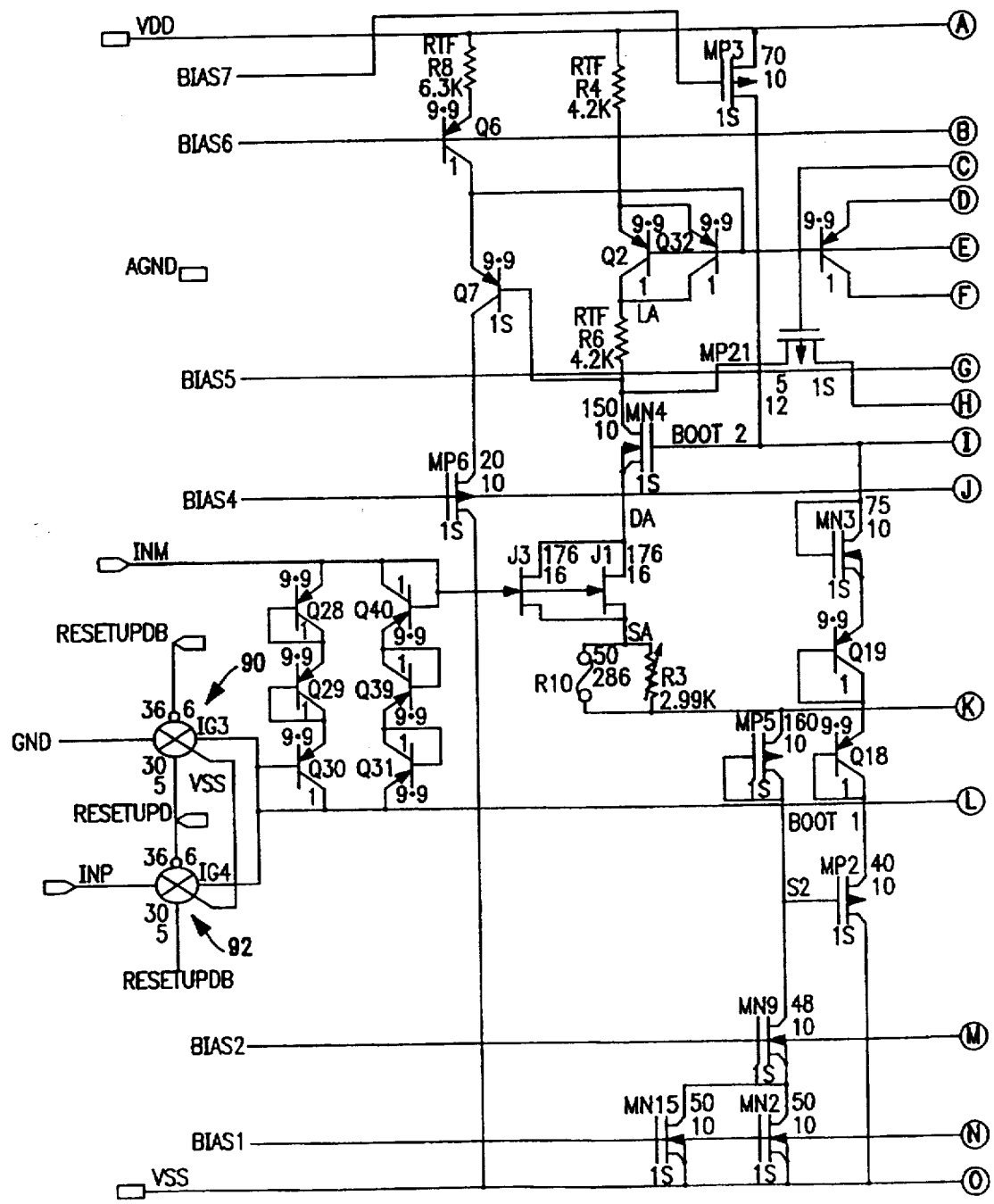
FIGS. 5A and 5B show is a circuit diagram of portions of the op amp, particularly showing the isolating and grounding switch circuitry at the amplifier input, and the amplifier bias voltage lines.
Figure 5B:
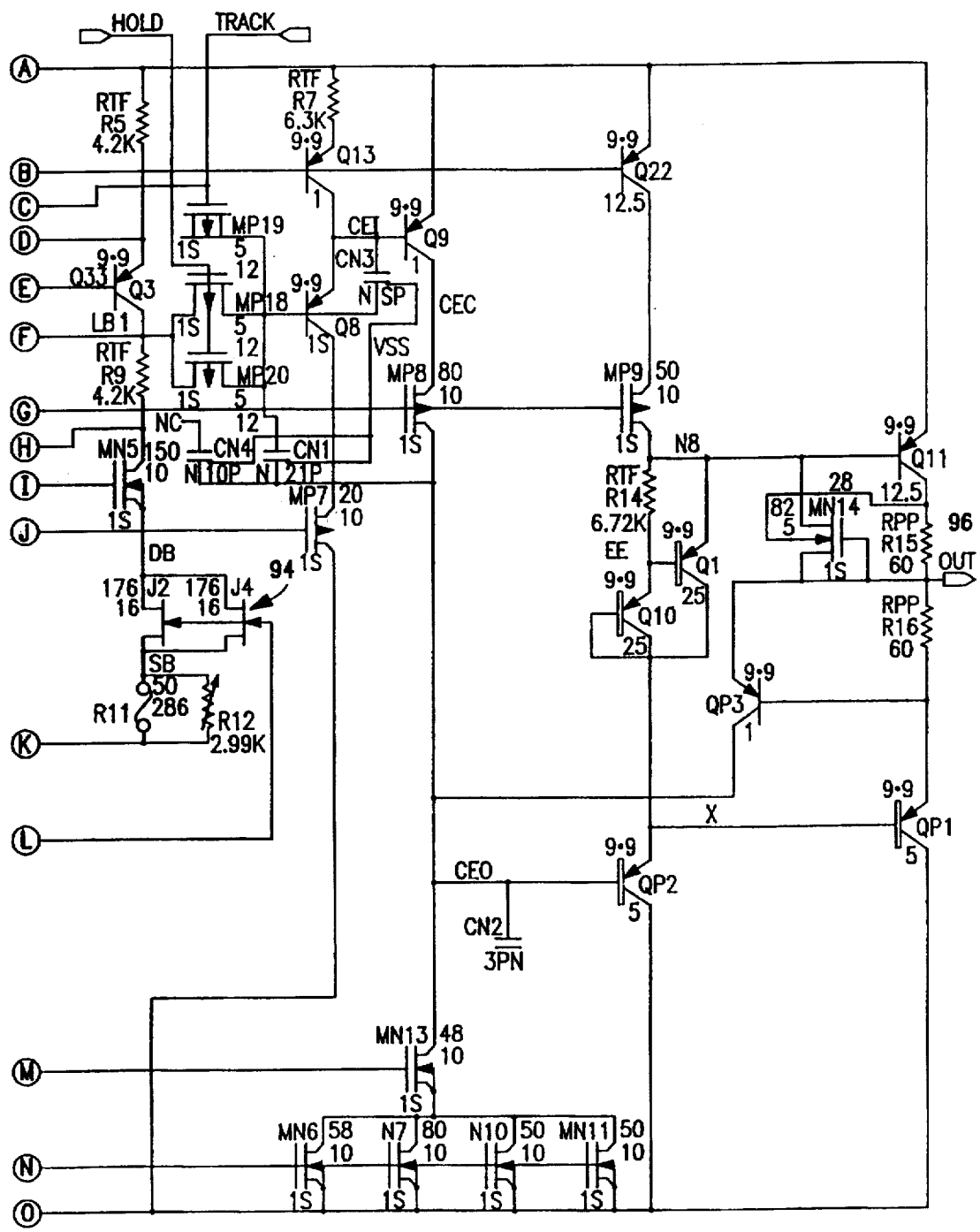

Referring now to FIGS. 5A and 5B, it will be seen that the RESETUPD signals are supplied to transmission gates 90, 92. The lower transmission gate 92 interrupts the connection from the DAC output (INP) to the op amp input at a transistor 94. At the same time, the amplifier input is grounded by the upper transmission gate 90 (J4). This brings the amplifier input to zero, so that the amplifier output 96 starts to go towards zero.

Figure 6:
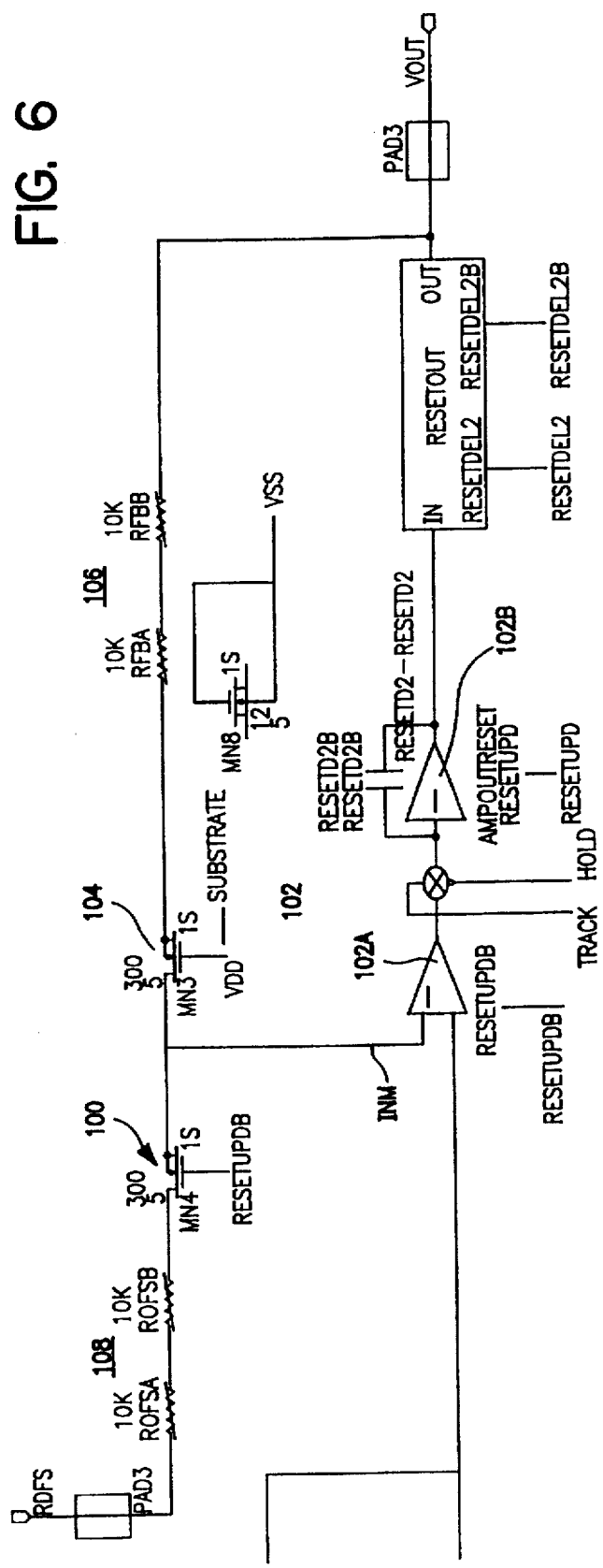
FIG. 6 shows an overall block diagram of the chip circuitry for developing control signals for avoiding instability in the D/A converter output.

Referring also to FIG. 6, which is an overall block schematic of the op amp and related circuitry, it will be seen that the RESETUPDB signal opens a switch 100 to reconfigure the op amp 102 (having two sections 102A, 102B) as a unity gain buffer. The inverting input of this amplifier receives a signal INM, which also is shown as an input to the detailed amplifier circuitry of FIG. 5. The circuitry connected to INM includes a switch 104 matching the switch 100, and gain-setting resistors 106 matching corresponding resistors 108. The pin ROFS connected to the resistors 108 can be supplied with an external signal for setting the op amp gain and offset. If the user has, for example, configured the amplifier for something other than unity gain, such as a 2X gain, the advent of RESET will change the gain to unity.

Figure 7:
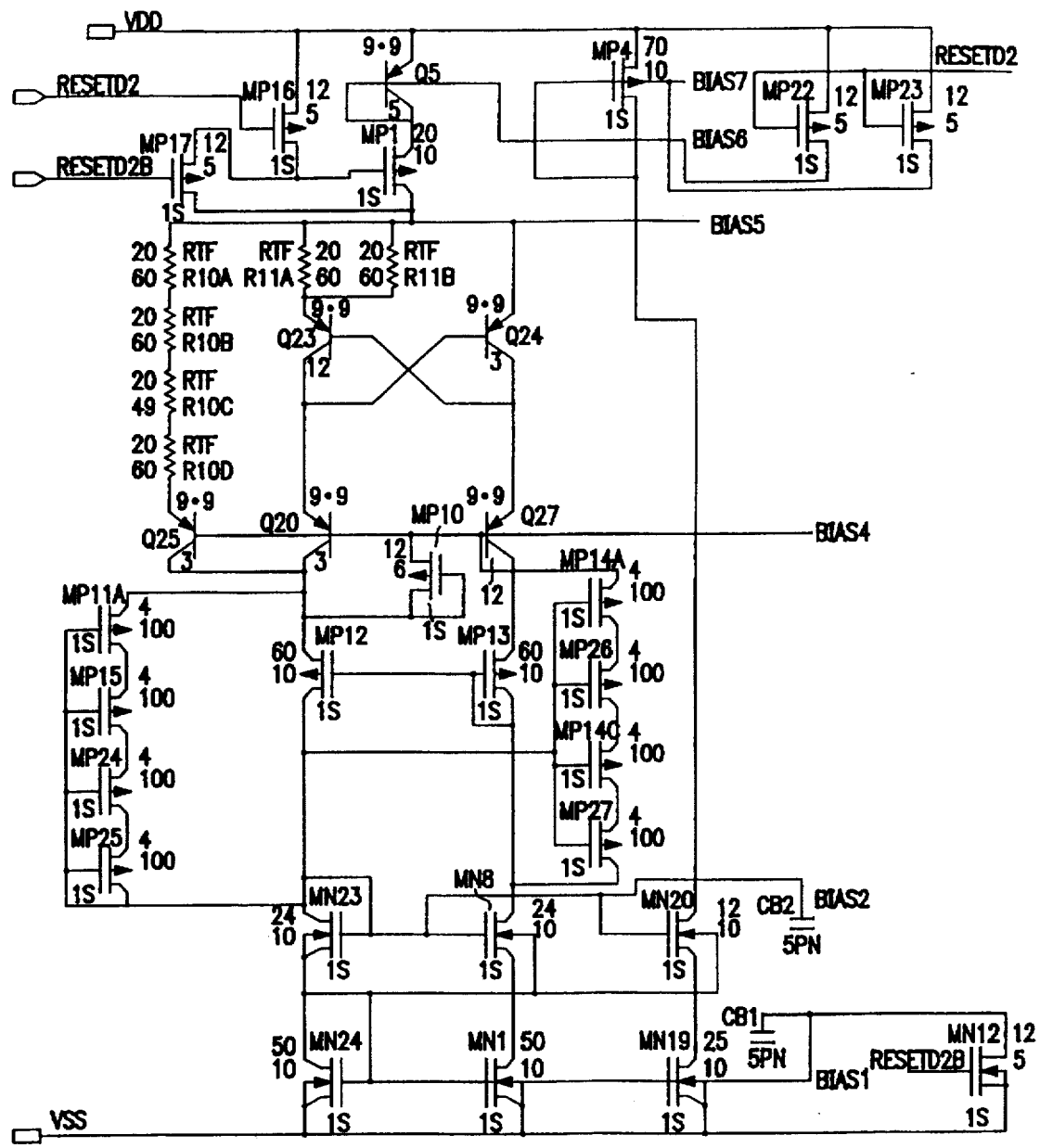
FIG. 7 presents a circuit diagram of further portions of the op amp including means for resetting bias voltages shown in FIGS. 5A and 5B.

When the signal RESETD2 (FIG. 3) is activated, about 3 μsec after RESET, the op amp becomes totally disabled. This is effected, for example, by killing a number of bias voltages in the amplifier. These bias voltages are shown on FIGS. 5A and 5B as Bias 1, Bias 5, Bias 6 and Bias 7. The circuitry for killing these bias voltages is shown in FIG. 7, which receives RESETD2 and RESETD2B to activate corresponding switches pulling resetting bias lines to $V_{DD}$ or $V_{SS}$. Thus the op amp is shut down totally at this time.

Figure 8:
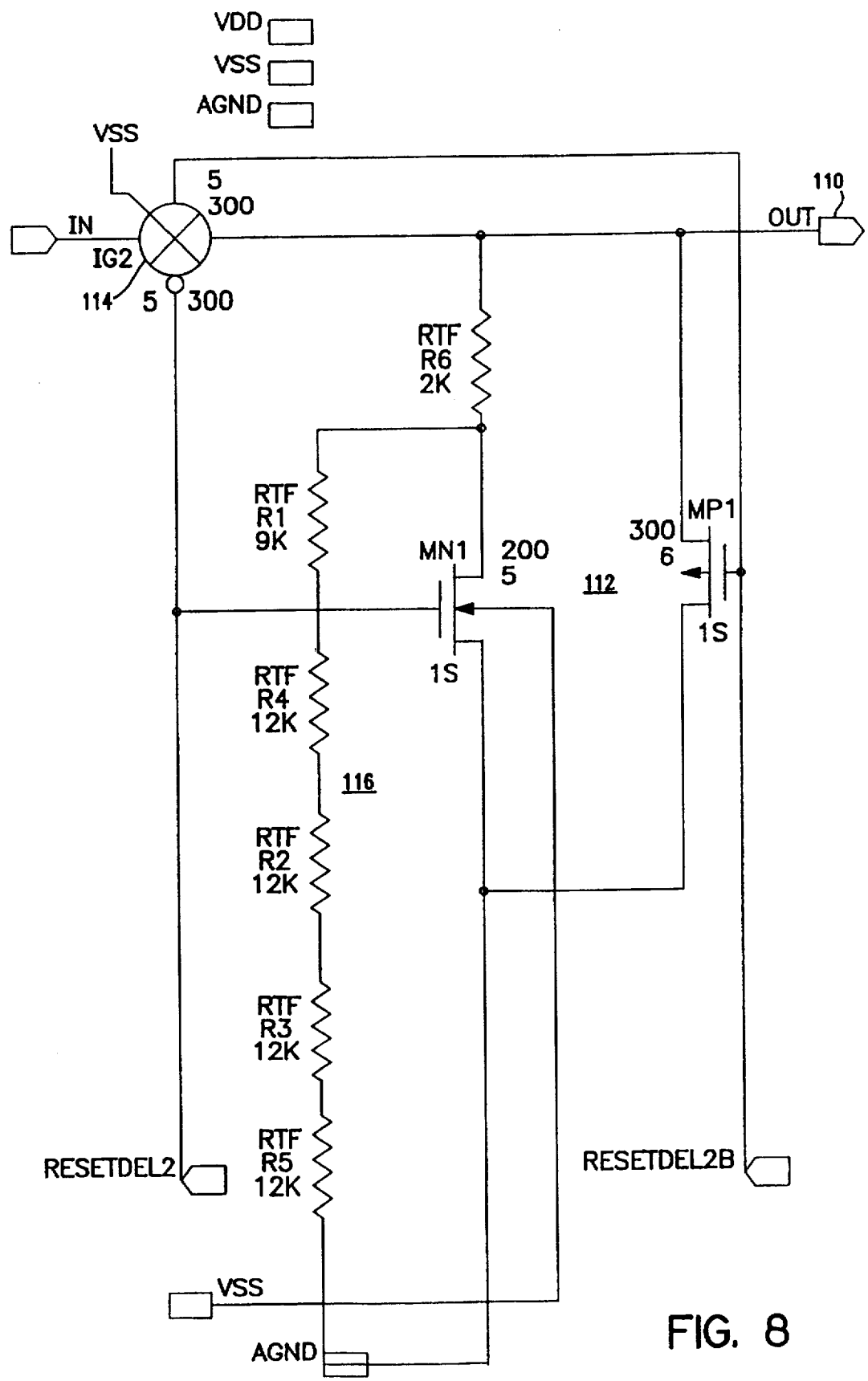
FIG. 8 is a circuit diagram of the amplifier output section, including the isolating and grounding switch circuitry for the output terminal.

At the same time, i.e., after the short time delay, the op amp 102 is isolated from the output terminal 110, shown in FIG. 8, and that output terminal is grounded. This is effected by a pull-down switch 112 and a transmission gate 114. This output section also includes a group of pull-down resistors 116 which provide for stable operation when $V_{DD}$ and $V_{SS}$ are less than threshold.

Figure 4B:
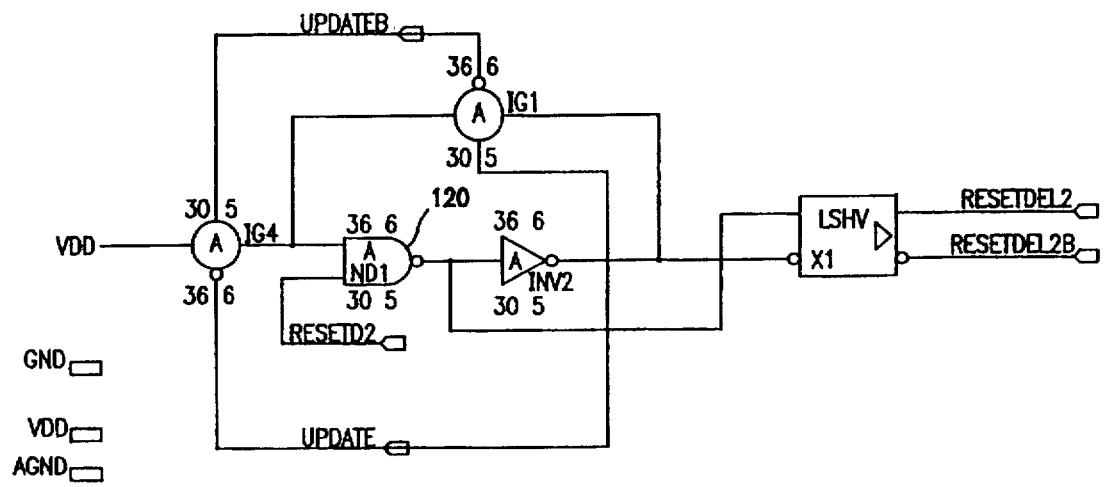

The switch 112 and transmission gate 114 are activated by control signals RESETDEL2 and RESETDEL2B, which are produced by the circuitry shown in FIG. 4B. This circuitry is basically the same as that shown in FIG. 4A and already described. However, it differs in that its Nand gate 120 receives the delayed signal RESETD2 rather than RESET, as in FIG. 4A. The RESETDEL2 signals with the output section circuitry shown in FIG. 8 complete the isolation of the op amp.

Referring again to FIG. 2, when the supply voltage returns to a level above its threshold, the RESET signal goes off, thereby switching the RESETD2 signals shown in FIG. 3. This in turn causes the bias signals in the op amp to be restored, permitting normal amplifier operation. However, the amplifier remains isolated from the DAC and the chip output terminal 110, because the signal RESETDEL2 is still active.

When a valid word has been loaded into the DAC register, an UPDATE signal is developed. This can be produced by internal chip circuitry ("auto-update") upon counting 16 bits, or by an externally developed LDAC signal produced, for example, by the user's processor. The control signals RESETUPD and RESETDEL2 thereupon return to their normal condition. This causes the DAC output to be connected to the op amp input and the ground to be removed from that input. Simultaneously, the op amp is reconfigured to its original state, its output is reconnected to the output terminal 110, and that terminal is ungrounded. Thus the system is returned to its original normal condition, avoiding unstable operation during the entire procedure following the power outage.

Figure 9:
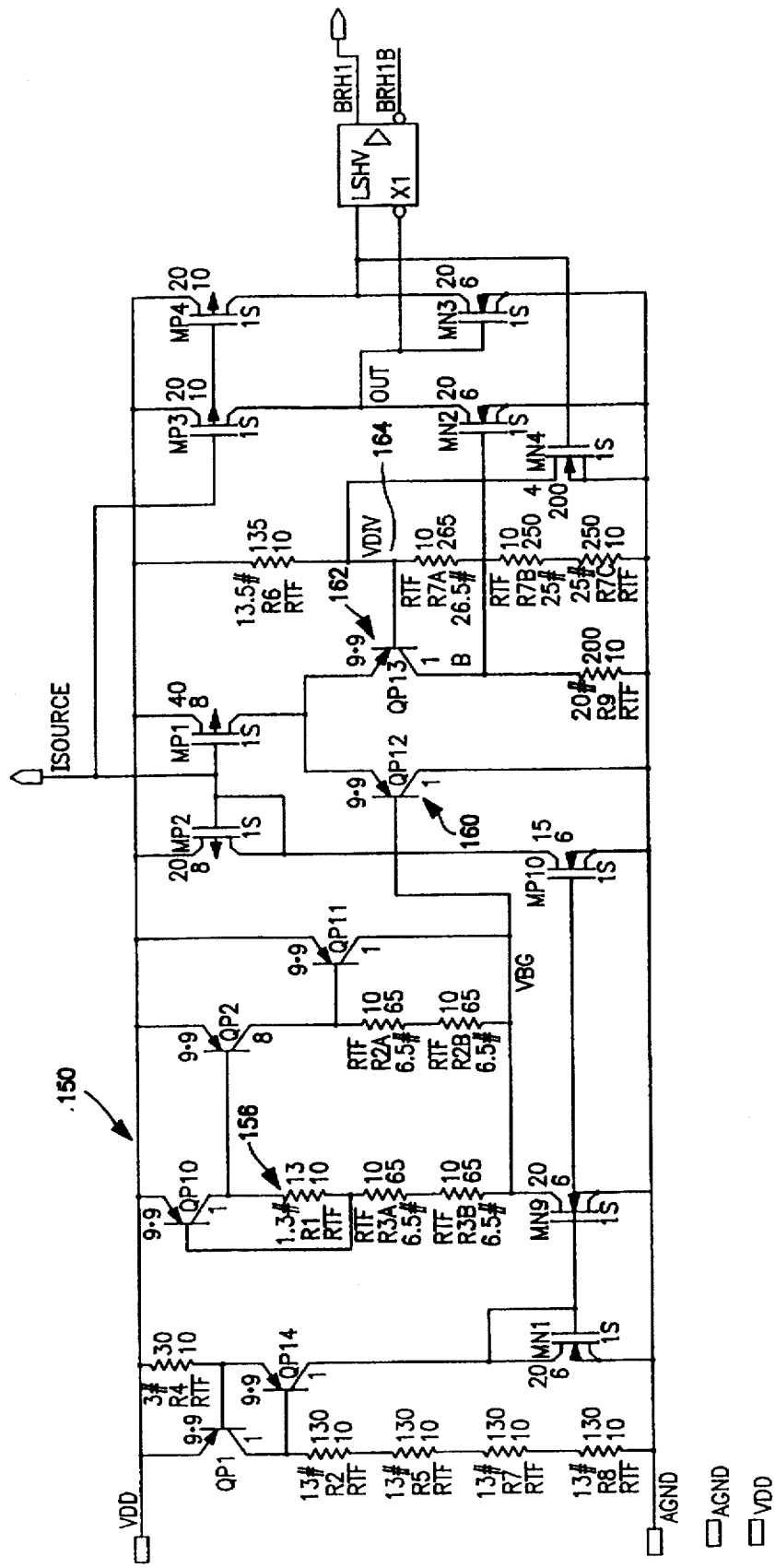
FIG. 9 is a schematic diagram of one exemplary voltage monitor.

FIG. 9 shows exemplary circuitry of one of the voltage monitors 40, 42, 44. This circuitry includes a band-gap voltage reference generally indicated at 150, comprising two bipolar transistors 152, 154 operated at different current densities. This produces a $\Delta V_{BE}$ voltage across a resistor 156. With the addition of a $V_{BE}$ voltage there is produced a temperature-stable voltage at a summing point 158. A corresponding stabilized voltage is translated to the base of one transistor 160 of a matched differential pair including transistor 162, and serving as a comparator to compare a divided-down supply voltage at point 164 to the temperature-stabilized reference voltage developed by the band-gap circuitry. When the supply voltage goes below a pre-set threshold, the monitor produces an output signal (BRH1) indicating such variance.

Figure 10:
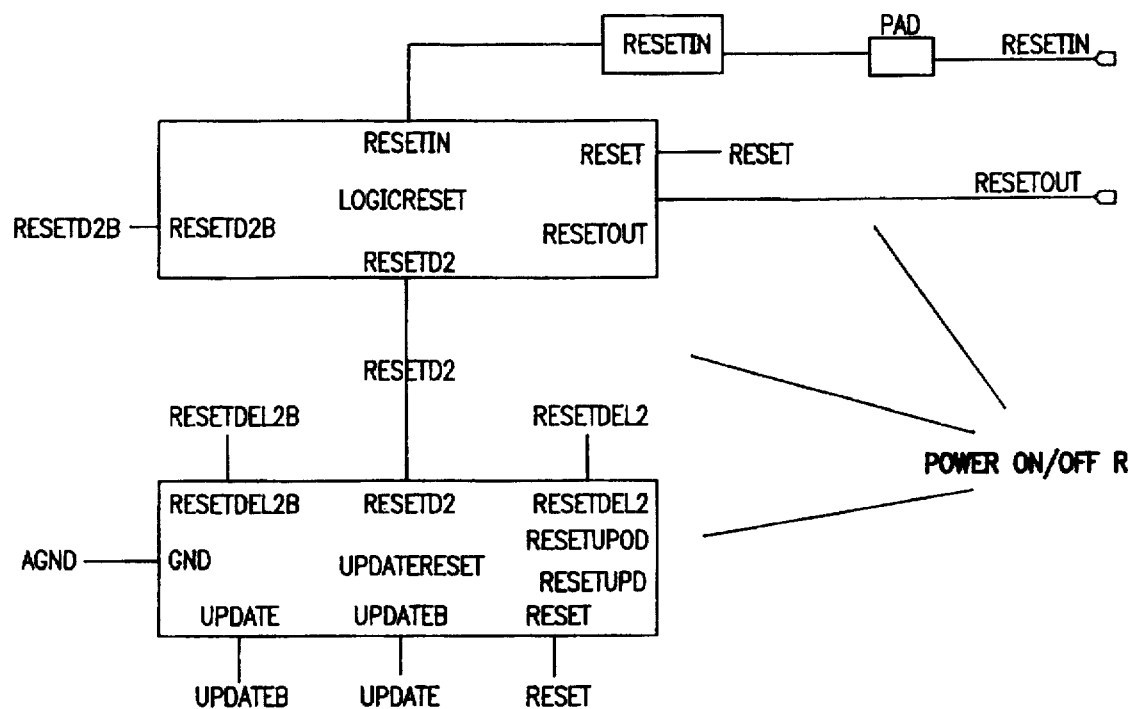
FIG. 10 is a block diagram of the overall system with control signal identities designated.

FIG. 10 is a block diagram of the overall control system, indicating functions performed and identifying control signals.

Although a preferred embodiment of the invention has been disclosed herein in detail, it is to be understood that this is for the purpose of illustrating the invention, and should not be construed as necessarily limiting the scope of the invention since it is apparent that many changes can be made by those skilled in the art while still practicing the invention claimed herein.

What is claimed is:

1. In an IC chip including a DAC and an amplifier to be energized by a power-supply voltage with a nominal operating voltage range, said amplifier having an input circuit to receive the DAC output signal and an output circuit producing an amplified signal for an output terminal; that improvement for preventing harmful output signal fluctuations comprising:

a voltage-monitoring device arranged to receive said power-supply voltage to detect its level;

said voltage-monitoring device including means operable to de-activate said amplifier input circuit when said voltage is detected to be outside of said operating range;

means including delay means to disable said amplifier after a delay period subsequent to said outside-of-range detection; and means for enabling said amplifier when said voltage level reaches its operating range.

2. Apparatus as in claim 1, wherein said means to de-activate said amplifier input circuit comprises means to isolate said input circuit from said DAC output.

3. Apparatus as in claim 1, wherein said means to de-activate said amplifier input circuit comprises means to connect said input circuit to a fixed reference voltage.

4. Apparatus as in claim 3, wherein said reference voltage is ground.

5. Apparatus as in claim 1, wherein said amplifier input circuit is de-activated by means to isolate said input circuit from said DAC output simultaneously with connecting said input circuit to a fixed reference voltage.

6. Apparatus as in claim 1, wherein said amplifier disabling means comprises means to alter bias voltages in said amplifier.

7. Apparatus as in claim 6, wherein at least certain of said bias voltages are changed to fixed reference voltages different from their normal levels.

8. Apparatus as in claim 1, wherein said amplifier disabling means comprises means to cut off at least certain bias current supplies.

9. Apparatus as in claim 1, including means responsive to said voltage-monitoring means for isolating said amplifier output circuit when said voltage is beyond said operating range.

10. Apparatus as in claim 9, wherein said output circuit isolating means is operable at the same time the amplifier is disabled.

11. Apparatus as in claim 10, including means for restoring said output circuit to operating condition when said monitored voltage is in its operating range.

12. Apparatus as in claim 9, including means to restore said input and output circuits to operating condition only when a valid word is available to said DAC for conversion.

13. Apparatus as in claim 1, including means for rearranging said amplifier from its conversion configuration to that of a unity-gain buffer prior to the disabling of said amplifier.

14. Apparatus as in claim 13, including means for reconfiguring said amplifier into a conversion configuration.

15. Apparatus as in claim 14, wherein said means for reconfiguring said amplifier is operative when a valid word has been loaded to said DAC for conversion.

16. In an IC chip including a DAC and an amplifier to be energized by a power-supply voltage with a nominal operating voltage range, said amplifier having an input circuit to receive the DAC output signal and an output circuit producing an amplified signal for an output terminal; that improvement for preventing harmful output signal fluctuations comprising:

a voltage-monitoring device arranged to receive said power-supply voltage to detect its level;

said voltage-monitoring device including means operable to de-activate said amplifier input and output circuits when said voltage is detected to be outside of said operating range; and means for restoring said amplifier input and output circuits to operating condition after said voltage level is in its operating range.

17. Apparatus as in claim 16, wherein said input and output circuits are de-activated by connecting them to reference voltages.

18. Apparatus as in claim 17, wherein said reference voltages are ground.

19. Apparatus as in claim 16, wherein said input and output circuits are de-activated by being isolated from said DAC output and said output terminal respectively.

20. In an IC chip including a DAC and an amplifier to be energized by a power-supply voltage with a nominal operating voltage range, said amplifier having an input circuit to receive the DAC output signal and an output circuit producing an amplified signal for an output terminal; that improvement for preventing harmful output signal fluctuations comprising:

a voltage-monitoring device arranged to receive said power-supply voltage to detect its level;

said voltage-monitoring device including means operable to de-activate said amplifier output circuit when said voltage is detected to be outside of said operating range;

means for re-activating said amplifier output circuit when said voltage level is in its operating range;

said voltage-monitoring device comprising a band-gap voltage reference for establishing a reference voltage for determining when said supply voltage is out of said operating range.

21. Apparatus as in claim 20, wherein said disabling means comprises means for de-activating said amplifier input and output circuits.

22. Apparatus as in claim 21, wherein said comparator comprises a differential pair of transistors receiving, respectively, a first signal corresponding to the band-gap reference voltage, and a second signal corresponding to said power-supply voltage.

23. In an IC chip including a DAC and an amplifier to be energized by a power-supply voltage with a nominal operating voltage range, said amplifier having an input circuit to receive the DAC output signal and an output circuit producing an amplified signal for an output terminal; that improvement for preventing harmful output signal fluctuations comprising:

a voltage-monitoring device arranged to receive said power-supply voltage to detect its level;

said voltage-monitoring device including means operable to produce a RESET signal to disable said amplifier after said voltage is detected to be outside of said operating range;

means for enabling said amplifier after said voltage level reaches its operating range; and means to receive a RESET signal from a source external to said IC chip for disabling said amplifier.

24. Apparatus as in claim 23, wherein said disabling means comprises means for de-activating said amplifier input and output circuits.

25. In an IC chip including connection pins and formed with a DAC and an amplifier to be energized by a power-supply voltage with a nominal operating voltage range, said amplifier having an input circuit to receive the DAC output signal and an output circuit producing an amplified signal for an output terminal; that improvement for preventing harmful output signal fluctuations comprising:

a voltage-monitoring device arranged to receive said power-supply voltage to detect its level and to produce a RESET signal when said voltage is out of its operating range;

means responsive to said RESET signal to disable said amplifier after said voltage is detected to be outside of said operating range;

means for enabling said amplifier after said voltage level is in its operating range; and means to produce said RESET signal on a pin of said chip to provide that said RESET signal can be directed to any other device in the system.

26. The method of preventing unstable output fluctuations from a DAC the output of which is directed to the input circuit of an amplifier having an output circuit producing a corresponding signal at an output terminal, said amplifier being energized by a power-supply voltage with a nominal operating range, said method comprising the steps of:

monitoring a power-supply voltage to sense the voltage level and to produce a RESET signal when the voltage is outside of a predetermined operating range; and de-activating both said amplifier input and output circuits in response to development of said RESET signal.

27. The method of claim 26, including the step of disabling said amplifier a short time after de-activating said input circuit.

28. The method of claim 24, including the step of enabling said amplifier at the termination of said RESET signal.

29. The method of claim 25, including the step of re-activating said input and output circuits when a valid word has been presented to said DAC for conversion.

30. The method of claim 26, including the step of arranging said amplifier as a unity-gain buffer at the start of said RESET signal.

31. The method of claim 30, including the step of reconfiguring said amplifier into a conversion configuration when a valid word has been loaded to said DAC for conversion after termination of RESET.

* * * * *